United States Patent
Rinke

(10) Patent No.: US 8,724,322 B2
(45) Date of Patent: May 13, 2014

(54) TARGETED LIQUID COOLING FOR A SYSTEM

(75) Inventor: Jordan Rinke, Live Oak, TX (US)

(73) Assignee: Rackspace US, Inc., San Antonio, TX (US)

( * ) Notice: Subject to any disclaimer, the term of this patent is extended or adjusted under 35 U.S.C. 154(b) by 372 days.

(21) Appl. No.: 13/069,696

(22) Filed: Mar. 23, 2011

(65) Prior Publication Data

US 2012/0243169 A1  Sep. 27, 2012

(51) Int. Cl.
*H05K 7/20* (2006.01)

(52) U.S. Cl.
USPC ..... 361/699; 361/679.53; 361/718; 62/259.2; 165/80.4

(58) Field of Classification Search
USPC ........... 361/676–678, 679.46–679.54, 361/688–720, 760, 807, 808, 820, 831
See application file for complete search history.

(56) References Cited

U.S. PATENT DOCUMENTS

| | | | |
|---|---|---|---|
| 7,511,957 B2 * | 3/2009 | Campbell et al. | 361/699 |
| 2003/0172669 A1 * | 9/2003 | Tilton et al. | 62/310 |
| 2004/0221604 A1 * | 11/2004 | Ota et al. | 62/259.2 |
| 2007/0183125 A1 * | 8/2007 | Tilton et al. | 361/699 |
| 2010/0246118 A1 * | 9/2010 | Attlesey | 361/679.53 |
| 2010/0263885 A1 * | 10/2010 | Tuma | 169/46 |
| 2011/0069453 A1 * | 3/2011 | Campbell et al. | 361/700 |
| 2011/0096503 A1 * | 4/2011 | Avery et al. | 361/701 |
| 2013/0083479 A1 * | 4/2013 | Tufty et al. | 361/679.53 |

OTHER PUBLICATIONS

HPC wire, Michael Feldman, "Blog from the Editor: Supercomputers When They Sizzle," Jul. 15, 2010, 2 pages.
Betanews, Angela Gunn, "Hardcore Computer intros total-immersion liquid cooling desktop," published 2009, 3 pages.
Green Revolution Cooling, "The Clear Solution for Data Center Cooling, The Carnot Jet System," 2011, 2 pages.

* cited by examiner

*Primary Examiner* — Courtney Smith
(74) *Attorney, Agent, or Firm* — Trop, Pruner & Hu, P.C.

(57) ABSTRACT

A cooling system for computer systems is disclosed. In one aspect, a method includes providing a flow of liquid coolant through conduits positioned within a server system, and spraying the liquid coolant via at least one outlet mechanism of each of the conduits. The outlet mechanisms are adapted to be placed in close proximity to a corresponding target component of one of the servers, to cool the target component.

18 Claims, 3 Drawing Sheets

TARGETED LIQUID COOLING FOR A SYSTEM

BACKGROUND

Cooling in many computer systems such as a rack-mounted server system is by way of a fan bank housed in the front or rear of a chassis supporting the servers that pulls air across the servers via air flow channels between the servers. To provide additional specific cooling for certain components such as a central processing unit (CPU) or other critical component, a heat sink, which is typically a metal device including radiators or other structures, can be adapted directly to the component to aid in cooling. In addition, some system components such as a CPU or hard drive may have individual fans in close association to further aid in cooling.

Other existing cooling methods including water-based cooling and immersion cooling. In water cooling, water flows through blocks that are adapted in place of heat sinks to withdraw heat via the water, which is then provided to an external radiator for cooling. Such water cooling is via a closed system because although water itself technically cannot conduct electricity, impurities in the water can cause electric conduction, such that great care must be taken to avoid contacting water on any electronic components. As a result, such water cooling can require very high maintenance because if a water leak occurs, the underlying equipment is destroyed.

Another cooling technique is full immersion cooling, where an entire server is sunk into an oil bath. The problem with this cooling technique is that hard drives cannot be located in the bath, so the hard drives have to be located on top of the bath, or must be sealed in environment-resistant enclosures. In addition, an immersion cooling system can take thousands of gallons of oil to be effective, and an entire data center may need to be reconfigured to provide for such cooling.

SUMMARY OF THE INVENTION

According to one aspect, the present invention is directed to a system having servers each configured on one or more circuit boards. Each server includes a processor adapted to a first side of the circuit board and a mass storage adapted to a second side of the circuit board. In addition, a liquid cooling system is present to provide a flow of coolant to be sprayed on the processor and the mass storage of each of the servers. In this way, cooling can be provided without the need for fan-based cooling, and without the need for auxiliary cooling mechanisms such as heat sinks or so forth. The system may include a recirculation system coupled to receive sprayed coolant collected at a collection terminal below the servers. The recirculation system can include a filter, a pump, a heat exchanger, and a return mechanism to return the coolant for further flow to target components.

To provide for such liquid cooling, the servers can be implemented in a sled having interconnect slots for coupling of the circuit boards. In addition, conduits can be configured within the sled, each having at least one outlet adjacent to a corresponding processor and/or mass storage. In one embodiment, the coolant can be mineral oil, which can be sprayed directly on the processor and/or a spindle of the mass storage.

Another aspect is directed to a system including one or more racks including servers each implemented on a circuit board, where each server includes a processor, a memory, and a disk storage device. In addition, the system includes conduits adapted about the servers to carry a flow of liquid coolant. Each of the conduits has at least one outlet to spray the liquid coolant onto a target component of a corresponding circuit board to provide cooling to the target component. Each outlet of the conduits includes at least one nozzle to direct the liquid coolant to the target component, which can be one of a processor, disk storage device, or other such component. Using such a system, the servers can be cooled without active air cooling.

Another aspect of the present invention is directed to a method that includes providing a flow of liquid coolant through conduits positioned within a server system, and spraying the liquid coolant via at least one outlet mechanism of each of the conduits. The outlet mechanisms are adapted to be placed in close proximity to a corresponding target component of one of the servers, to cool the target component.

DETAILED DESCRIPTION

Figure 1:
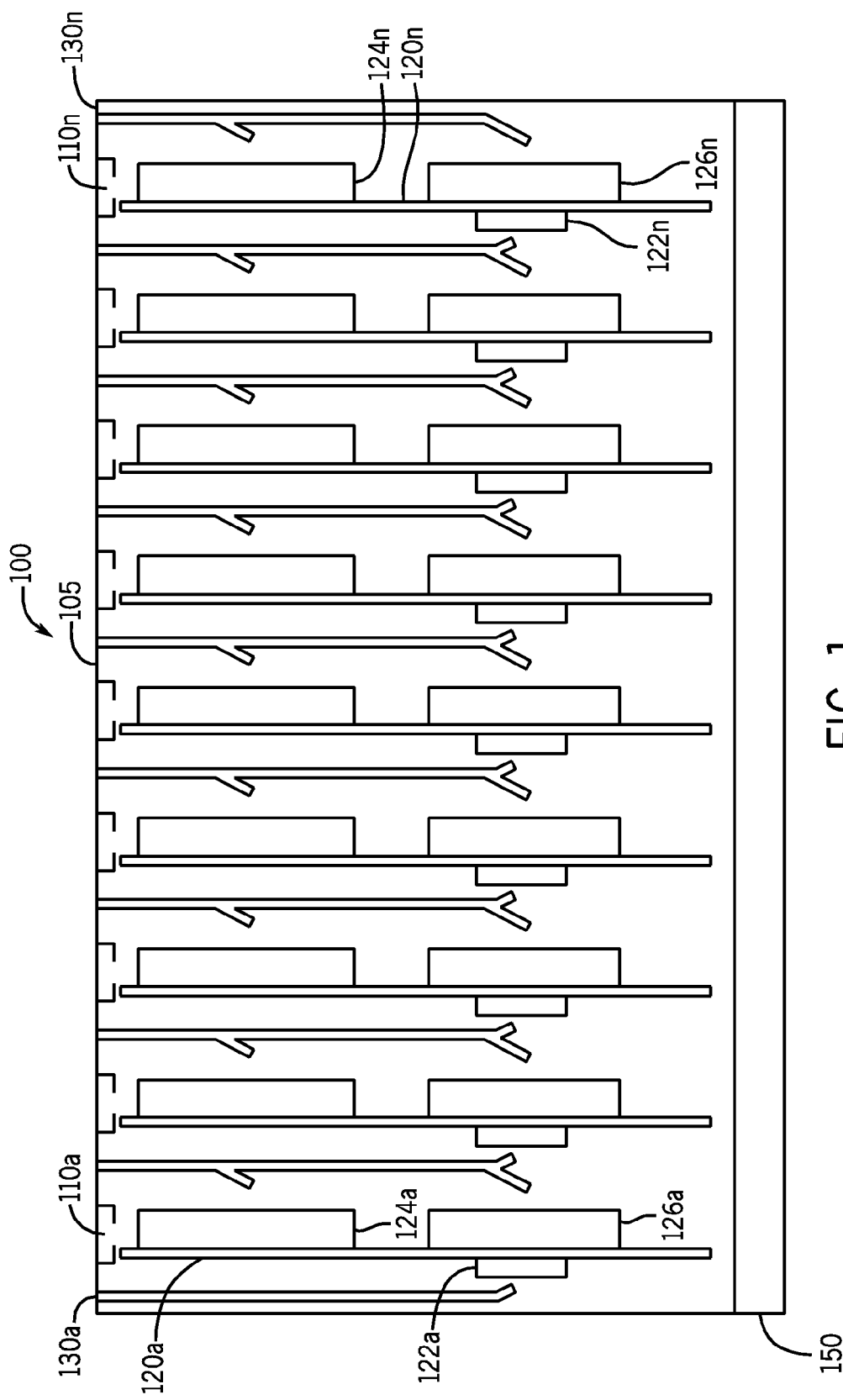
FIG. 1 is a front view illustration of a collection of servers having a cooling implementation in accordance with an embodiment of the present invention.

In various embodiments, a liquid cooling system can be provided for computer systems such as server systems as present in a data center, e.g., rack-mounted servers. The liquid cooling can be realized by various liquids, but in many implementations mineral oil may be used as the liquid coolant, as it is readily available and has a high thermal conductivity while being electrically non-conductive.

Although many different implementations can be realized, some may be of relatively simple design, avoiding fine-grained flow control for ease of installation and operation. This is so, as even in a cooling system in which an equal flow control is provided to all outlets of the cooling system, sufficiently adequate cooling of various components of the servers subject to high heat can be realized.

In a given installation for rack-mounted servers and assuming the liquid coolant to be mineral oil, the following discussion provides a high level overview of cooling in accordance with an embodiment of the present invention. Mineral oil can be pumped to individual server racks (pumps can either be at the end of a main line of the system, or in each cabinet for specific flow). Oil can be sprayed via conduits such as flexible positional tubes to exact locations to be cooled, namely one or more target components of each server. The bottom of each chassis can have a collection pan with a slight rearward grade so the oil can drain out the back of the collection pan to one or more collection pathways for recirculation. In one embodiment, collected oil can be pumped out to radiators on the outside of a building housing the servers or to another location, where either ambient airflow or fans can cool the oil for recirculation in a complete closed system.

A sled, which may be formed of aluminum, can be used to mount the servers, and in turn this sled may slide into a chassis. The chassis includes a backplane that distributes power and networking, disk I/O, and other traffic. But in many implementations, airflow through the server configuration may not be needed, as the sprayed oil from the conduits is directed to target components (and directly onto the components), and then the oil drops down to the bottom of the sled via gravity where it is collected.

Using a sled having interconnection slots to electrical circuit boards (e.g., via finger electrodes of the boards), a CPU can be mounted on one side of a board, and hard disk drives (HDDs) mounted on the other side. Oil can be sprayed directly on the CPU (no heat sink required) and on memory if desired in a specific configuration. On the HDD side of the chassis, oil can be sprayed directly onto the center spindle of the HDD(s), from which most of the heat radiates. Various components can have slight angles to aid in making sure the oil is isolated to where it is sprayed and then properly collected. This focuses the cooling energy on the parts that need cooling, reducing the actual amount of energy needed to cool a server and also allowing exact cooling to take place. Flow control can maintain an exact temperature, making sure there is no energy wasted on non-essential items or overcooling.

In the case of a malfunction or other situation in a server, an individual server may be pulled out of its rack and allowed to drain for a moment before being worked on. This can either be accomplished by shutting off a value to that specific machine or by having a rail at the bottom of the sled, allowing the system to be pulled straight out while the oil is flowing, and then allowing drainage and cooling in open air.

Referring now to FIG. 1, shown is a front view illustration of a collection of servers having a cooling implementation in accordance with an embodiment of the present invention. Specifically, FIG. 1 shows a portion of a rack-mounted server system 100 that includes a server sled 105 that houses and provides electrical connections for a plurality of individual servers. As seen, each of the circuit boards can be configured to sled 105 via a corresponding slot 110*a*-110*n*, which may provide a mechanical and electrical interconnection to the server system. More specifically, as seen multiple servers 120*a*-120*n* may be implemented by way of circuit board-based servers having various electrical components adapted on the circuit board. In the high level illustration shown in FIG. 1, such components include a CPU 122*a*-122*n* on a front side of each board. In addition, on a backside of each circuit board, one or more HDDs may be present, including HDDs 124*a*-124*n* and HDDs 126*a*-126*n*.

Thus via a cooling implementation in accordance with an embodiment of the present invention, circuit boards can be closely packed and furthermore can include all components of a given server, including both semiconductor components as well as mass storage in the form of these HDDs adapted to a backside of the circuit board. While shown with two such HDDs in the embodiment of FIG. 1, understand that in different implementations more or fewer HDDs may be associated with each circuit board. Furthermore, understand that while shown in the high level illustration of FIG. 1 as including a single CPU 122 adapted to each circuit board, the scope of the present invention is not limited in this regard and multiple such CPUs can be present in a particular implementation. Also, while only the CPU is shown for ease of illustration, understand that various other components can be adapted to the circuit boards, including other processors such as network processors, specialized function processors, memory, peripheral components, controllers including IO controllers, network controllers, and so forth.

As further seen in FIG. 1, to provide cooling to the servers, a plurality of conduits 130*a*-130*n* may be present, each of which can be configured to provide directed spray cooling to one or more target components. As seen, the conduits may be differently configured to provide cooling to a given one or more target component. For example, a first conduit 130*a* may provide cooling to a first CPU 122*a*. Additional conduits 130*b*-130*n* may be present which can provide cooling to associated HDDs and/or CPUs. As also seen, a single conduit can have outlets that spray coolant to components of multiple different servers (e.g., a HDD of a first server and a CPU of a second server). Thus for a given installation, a variety of different conduits can be present, each of which can be targeted to particular components of a server that may be prone to high heat. In general, these components can include processing units such as CPUs, graphics processing units (GPUs) or other high speed processors, as well as mass storage devices such as the HDDs. Of course, additional components of a server can be spray cooled as well, although not shown in the illustration of FIG. 1.

During normal operations, oil or another coolant flowing through the conduits may thus be output via the outlet portions of the corresponding conduits and sprayed directly on the target components of the servers. In one embodiment, the conduits can be plastic flexible tubing that can be bent or otherwise positioned for ready adaptability to a given design. In some embodiments, the conduit outlet portions may include nozzles or other flow control outlet mechanisms to regulate the output onto the components. For example, various sized nozzles may be provided or in some implementations a cut open pipe can be present with flow control via valves.

After spray cooling, the oil or other coolant may simply follow gravity down to a collection area 150, which may be a collection pan or other collection agent that receives the coolant and directs it to a recirculation system, which in various embodiments may include various tubing or other piping, filtering means, heat exchanger means, pumping means and so forth. While shown with this particular embodiment in the illustration of FIG. 1, understand the scope of the present invention is not limited in this regard.

In some embodiments, server density may be made much higher than possible with air cooling systems. In addition, embodiments avoid the risks of water and bulky water blocks, or massive vats of liquid coolant of a submersion system. In some implementations, multiple servers deep can be configured within a single slot of a sled and anywhere from 4 to 8 systems wide per container can be realized. This also eliminates the need for hot or cold row cooling configurations. That is, a blade configuration is typically only one server deep, whereas with cooling in accordance with an embodiment of the present invention that can forego the rack-mounted fans of a conventional rack-mounted server system, multiple servers deep can be fit, achieving higher density. Also, via the modular sled design, circuit boards smaller than a standard ATX configuration can be implemented.

Figure 2:
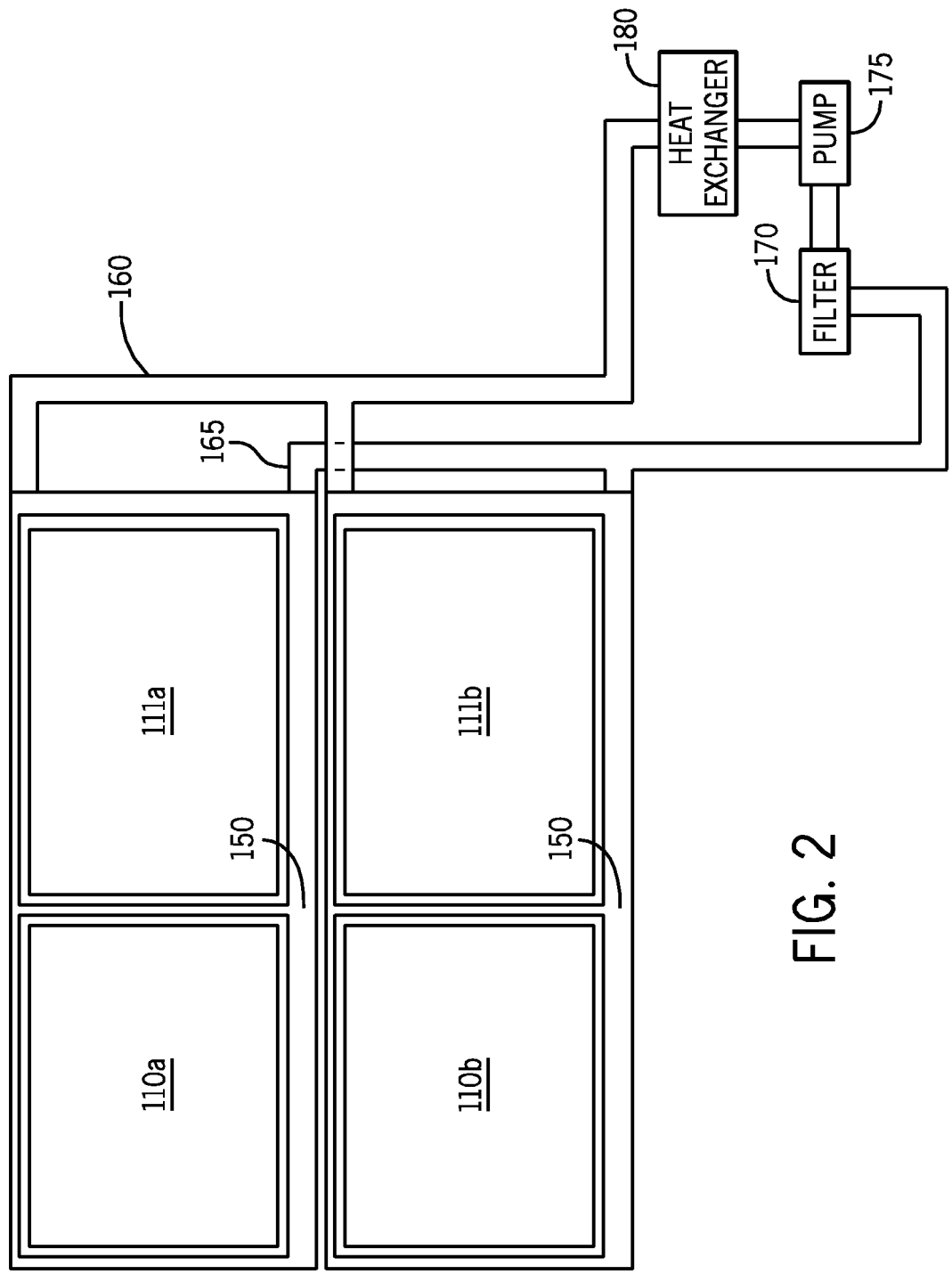
FIG. 2 is a side view of a rack-mounted server implementation in accordance with an embodiment of the present invention.

Furthermore, as discussed above additional cooling mechanisms often used such as heat sinks, closely coupled fans and so forth can also be avoided, enabling higher density in both lateral and horizontal directions. Referring now to FIG. 2, shown is a side view of a rack-mounted server implementation in accordance with an embodiment of the present invention. As shown in the illustration of FIG. 2, owing to the size advantages of a cooling system in accordance with a given embodiment, multiple servers can be positioned horizontally within a chassis. In this way, the density of servers can be doubled or more, since in contrast to a conventional rack-mounted server in which a single server deep is provided by way of a single circuit board, two circuit boards 110*a* and 111*a* deep may be provided in a given chassis or sled, thus at least doubling the density of servers. Instead in a conventional rack-mounted system fans and other cooling components would be present in place of circuit boards 111*a* and 111*b*.

Also shown at a high level in the illustration of FIG. 2 are details of a representative cooling system. Specifically, input conduits 160 located at a top backside of the sleds provide coolant that can be routed to the plurality of individual conduits within the sleds, while output conduits 165 may be configured, e.g., at a bottom backside of the sleds to receive an outgoing flow of oil after it has been sprayed on the target components. Thus output conduits 165 may be coupled to a backside of collection area 150. As further shown in FIG. 2, the output conduits can be coupled to a recirculation system that includes at an input a filter 170 and a pump 175 that can pull the incoming oil and pump it through a heat exchanger 180. In some implementations, the heat exchanger may be external to a building to provide for cooling of the oil before it is returned to cool the servers via input conduits 160. In one embodiment, oil can be filtered by an oil filter such as an automotive or similar oil filter, which can be located, for example, in a small container on the back of a rack. Instead of mineral oil, the liquid coolant could be another non-conductive oil or other non-conductive liquid.

In another implementation, pump 175 can be located on a front end of the rack. For example, a smaller pump to regulate cooling per rack mount chassis can be provided, e.g., at a front end, or a large industrial pump can be located at a backend that pumps through multiple racks via a single pump. After spraying, the oil in the racks can be drained back into a collection feed and then to the pump. In this case, coolant draws from that feed and pushes the coolant through heat exchangers, and back into the system. While shown with this simplified view in the embodiment of FIG. 2, understand that a recirculation system can include additional components and furthermore the components shown can be more widely distributed or provided in a different order, in different implementations.

Using a design in accordance with an embodiment of the present invention, current server racks can be retrofit with an oil cooling technique. In a data center with a raised floor that can support coolant piping, racks can be retrofit one at a time so that a cooling system in accordance with an embodiment of the present invention can be installed into a data center over a period of time.

Figure 3:
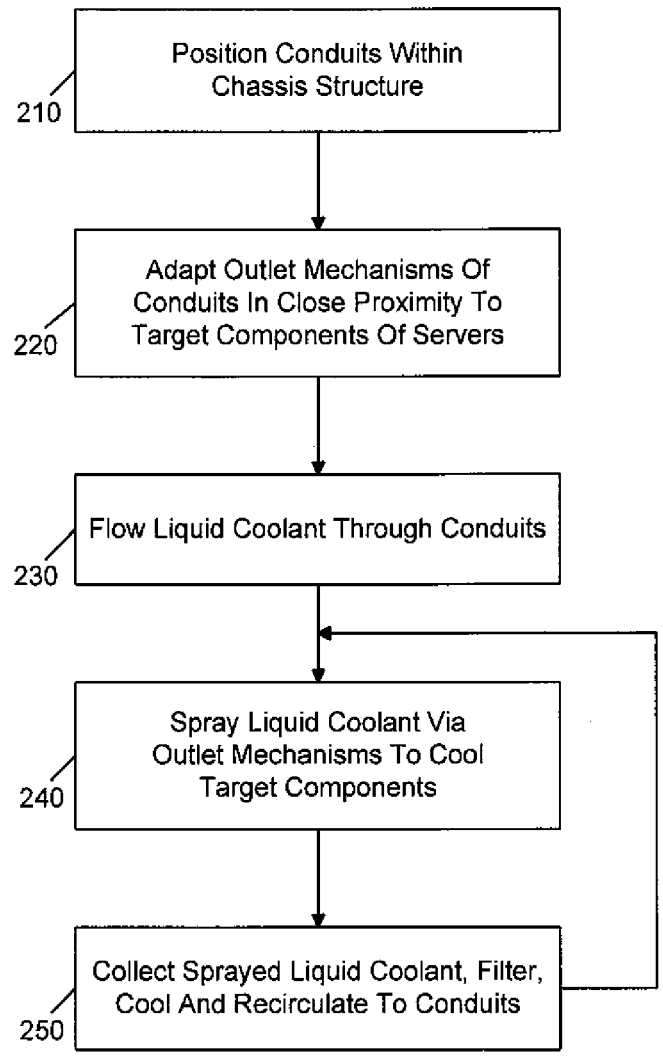
FIG. 3 is a flow diagram of a cooling method in accordance with an embodiment of the present invention.

Referring now to FIG. 3, shown is a flow diagram of a cooling method in accordance with an embodiment of the present invention. As shown in FIG. 3, method 200 may be used both to initially configure a liquid cooling system into one or more server racks of a data center, as well as to provide cooling during normal operation.

Method 200 may begin by positioning conduits within a chassis structure (block 210). For example, the various conduits such as shown in FIG. 1 can be routed through given chassis and/or sleds. In some implementations, the conduits can be affixed to portions of the chassis, and the sled can be removably inserted or withdrawn from the chassis to thus locate circuit boards corresponding to the servers in close proximity to given conduits. Or in other embodiments the conduits can be routed within the sleds themselves.

In either event, in addition to positioning the conduits themselves, the outlet mechanisms of the conduits, which may be nozzle heads, ends of tubing or so forth, can be adapted to be placed in close proximity to target components of the servers, such as CPUs and/or HDD's, or other such components (block 220).

Accordingly at this time, the cooling system is ready for cooling operations. It is assumed that a complete cooling system including its recirculation system is in place. Thus control passes to block 230, where flow of liquid coolant may be provided through the conduits. As discussed above, this liquid coolant can in one embodiment be mineral oil, and in different implementations various flow rates can be used. Accordingly, the liquid coolant is sprayed onto target components of the servers via the outlet mechanisms (block 240). Then the force of gravity will cause the sprayed liquid coolant to the drop down to a collection member such as a collection pan at a bottom of each chassis. The collected coolant can be provided to the recirculation system where it can be filtered, cooled and recirculated back to the conduits (block 250). Of course, different applications are possible and may include providing various means of flow control on a more fine-grained level.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
   a plurality of servers each located on at least one circuit board, and each including a processor positioned on a first side of the at least one circuit board and a mass storage positioned on a second side of the at least one circuit board, the second side opposite to the first side; and
   a liquid cooling system to provide a flow of coolant and including a first conduit having a first outlet to spray the coolant directly on the processor of a first one of the plurality of servers and a second conduit having a second outlet to spray the coolant directly on the mass storage of the first one of the plurality of servers.

2. The system of claim 1, further comprising a sled having a plurality of interconnect slots at a top thereof to couple the at least one circuit board of each of the plurality of servers, wherein the first sever and a second server are coupled to the sled via a first interconnect slot.

3. The system of claim 1, wherein the first conduit includes the first outlet adjacent to the processor of the first server and includes a second outlet adjacent to the mass storage of a second server.

4. The system of claim 3, wherein the coolant comprises mineral oil.

5. The system of claim 4, wherein the coolant is to be sprayed directly on the processor, the processor not having a heat sink adapted thereto.

6. The system of claim 5, wherein the coolant is to be sprayed directly on a spindle of the mass storage.

7. The system of claim 1, wherein the plurality of servers are cooled without fan cooling.

8. The system of claim 3, further comprising a collection area at a bottom of the sled to collect the coolant after spraying.

9. The system of claim 8, further comprising a recirculation system coupled to the collection area to filter the coolant, and return the coolant to the plurality of conduits.

10. The system of claim 9, wherein the recirculation system includes a filtration mechanism, a pump, and a heat exchanger.

11. A system comprising:
    a rack including a plurality of servers each implemented on a circuit board, each server including a processor, a memory, and a disk storage device; and
    a plurality of conduits adapted about the plurality of servers, the conduits to carry a flow of liquid coolant, each of the conduits having at least one outlet to spray the liquid coolant directly onto a target component of a corresponding circuit board to provide cooling to the target component, wherein a first conduit is adjacent to a front side of a first circuit board and has a first outlet to spray the liquid coolant directly onto a first processor located on the front side of the first circuit board and a second conduit is adjacent to a rear side of the first circuit board and has a first outlet to spray the liquid coolant directly onto a first disk storage device located on the rear side of the first circuit board.

12. The system of claim 11, further comprising a collection pan located below the rack to collect the liquid coolant and to direct the liquid coolant to a recirculator.

13. The system of claim 12, wherein the recirculator includes a pump to recirculate the liquid coolant to the plurality of conduits.

14. The system of claim 11, wherein the at least one outlet of the conduits includes at least one nozzle to direct the liquid coolant to the target component.

15. The system of claim 11, wherein the rack does not provide for active air cooling.

16. The system of claim 11, wherein at least one of the conduits has a first outlet to spray the liquid coolant on a first target component of a first circuit board and a second outlet to spray the liquid coolant on a second target component of a second circuit board.

17. A method comprising:
providing a flow of liquid coolant through a plurality of conduits positioned within a server system including a plurality of servers each implemented on a circuit board; and
spraying the liquid coolant via a first outlet mechanism of a first conduit onto a first target component of a first circuit board, the first outlet mechanism positioned in close proximity to the first target component, and spraying the liquid coolant via a second outlet mechanism of the first conduit onto a second target component of a second circuit board to directly cool the first and second target components to provide the directed spray cooling to the target components.

18. The method of claim 17, further comprising collecting the sprayed liquid coolant via gravity in a collection area below the plurality of servers and providing the sprayed liquid coolant to a recirculation system for filtration, cooling and recirculation to the plurality of conduits.

* * * * *